(12) United States Patent
Tachibana et al.

(10) Patent No.: US 8,525,203 B2
(45) Date of Patent: Sep. 3, 2013

(54) SEMICONDUCTOR LIGHT EMITTING DEVICE

(75) Inventors: Koichi Tachibana, Kanagawa-ken (JP); Hajime Nago, Kanagawa-ken (JP); Toshiki Hikosaka, Tokyo (JP); Shigeya Kimura, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 12/874,510

(22) Filed: Sep. 2, 2010

(65) Prior Publication Data

US 2011/0198561 A1 Aug. 18, 2011

(30) Foreign Application Priority Data

Feb. 16, 2010 (JP) ................................. 2010-031457

(51) Int. Cl.
*H01L 33/00* (2010.01)

(52) U.S. Cl.
USPC ................. 257/98; 257/13; 257/99; 257/100; 257/E33.034

(58) Field of Classification Search
USPC .......................... 257/13, 98, 99, 100, E33.034
See application file for complete search history.

(56) References Cited

U.S. PATENT DOCUMENTS

2006/0108603 A1* 5/2006 Uemura et al. ............... 257/194

FOREIGN PATENT DOCUMENTS

| JP | 2003-204122 | 7/2003 |
|----|-------------|--------|
| JP | 3446650 | 7/2003 |
| JP | 2006-245165 | 9/2006 |
| JP | 2007-207827 | 8/2007 |
| JP | 2008-277867 | 11/2008 |

OTHER PUBLICATIONS

U.S. Appl. No. 12/871,285, filed Aug. 30, 2010, Koichi Tachibana, et al.
Japanese Office Action issued Sep. 1, 2011, in Patent Application No. 2010-031457 (with English-language translation).
Office Action issued Jan. 7, 2013, in Japanese Patent Application No. 2011-276729, (with English-language Translation).
Japanese Office Action issued Mar. 26, 2012 in Patent Application No. 2011-276729 with English Translation.

* cited by examiner

*Primary Examiner* — Tan N Tran
(74) *Attorney, Agent, or Firm* — Oblon, Spivak, McClelland, Maier & Neustadt, L.L.P.

(57) ABSTRACT

According to one embodiment, a semiconductor light emitting device includes an n-type semiconductor layer, a p-type semiconductor layer, a light emitting portion, a first layer, a second layer, and an intermediate layer. The semiconductor layers include nitride semiconductor. The light emitting portion is provided between the n-type semiconductor layer and the p-type semiconductor layer and includes a quantum well layer. The first layer is provided between the light emitting portion and the p-type semiconductor layer and includes $Al_{x1}Ga_{1-x1}N$ having first Al composition ratio x1. The second layer is provided between the first layer and the p-type semiconductor layer and includes $Al_{x2}Ga_{1-x2}N$ having second Al composition ratio x2 higher than the first Al composition ratio x1. The intermediate layer is provided between the first layer and the light emitting portion and has a thickness not smaller than 3 nanometers and not larger than 8 nanometers and includes $In_{z1}Ga_{1-z1}N$ ($0 \leq z1 < 1$).

58 Claims, 8 Drawing Sheets

SEMICONDUCTOR LIGHT EMITTING DEVICE

CROSS-REFERENCE TO RELATED APPLICATIONS

This application is based upon and claims the benefit of priority from the prior Japanese Patent Application No. 2010-031457, filed on Feb. 16, 2010; the entire contents of which are incorporated herein by reference.

FIELD

Embodiments described herein relate generally to a semiconductor light emitting device.

BACKGROUND

Using nitride-based III-V group compound semiconductors such as gallium nitride (GaN), there have been developed semiconductor light emitting devices such as high-intensity ultraviolet to blue and green light emitting diodes (LED) and blue-violet to blue and green laser diodes (LD).

In order to achieve a higher efficiency in an LED, it is important to improve crystallinity of a GaN-based semiconductor, to reduce defects and non-radiative recombination centers, and to increase an internal quantum efficiency inside a crystal. It is also important how to recombine electrons and holes for light emission in an active layer. Electrons are likely to overflow from the active layer. On the other hand, holes are likely to have a low carrier density because an activation ratio of a p-type impurity is low.

JP-B 3446660 proposes the configuration provided with a cap layer between an active layer and a p-type clad layer, the cap layer including a layer which is grown using an $N_2$ gas for preventing the active layer from being separated and a layer which is grown using an $H_2$ gas for forming a potential barrier.

However, this technique still has room for improving a light emitting efficiency.

DETAILED DESCRIPTION

Figure 1:
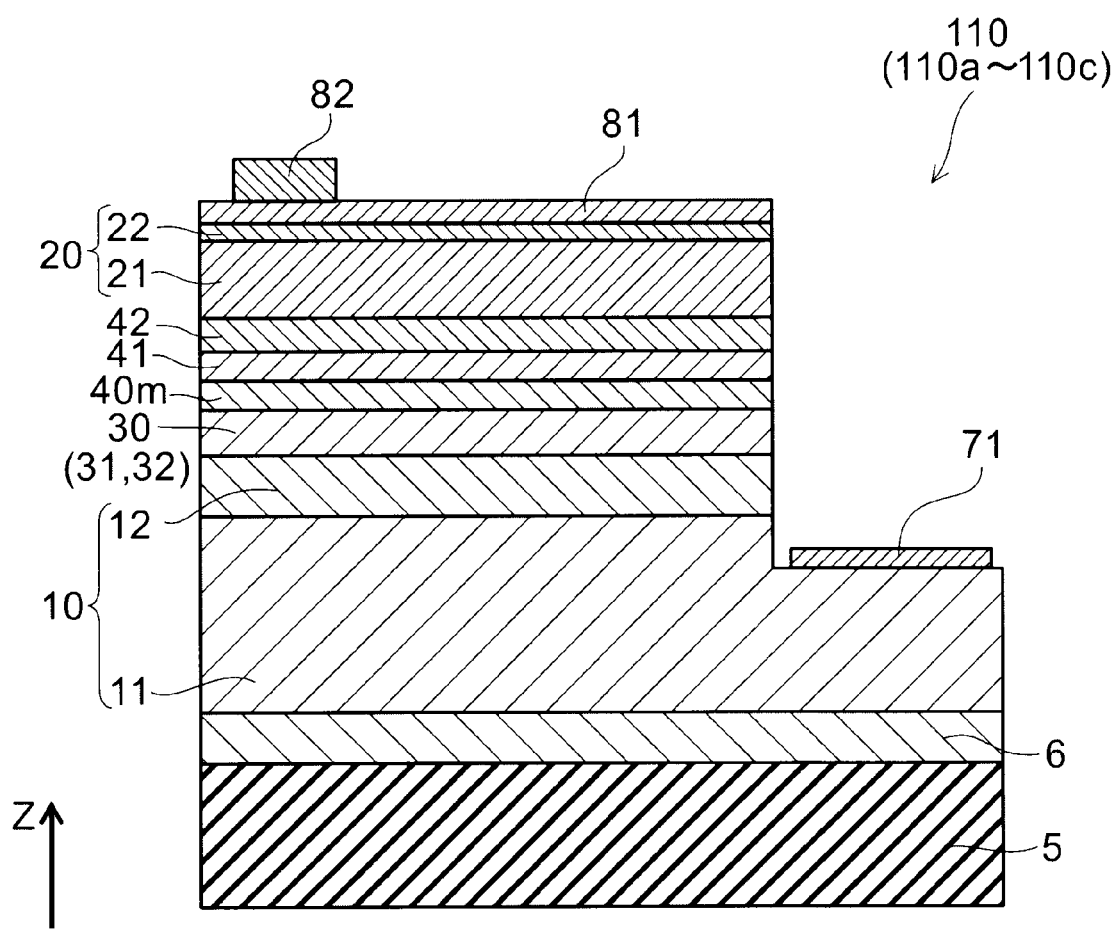
FIG. 1 is a schematic cross-sectional view showing the configuration of a semiconductor light emitting device.

In general, according to one embodiment, a semiconductor light emitting device includes an n-type semiconductor layer, a p-type semiconductor layer, a light emitting portion, a first layer, a second layer, and an intermediate layer. The n-type semiconductor layer includes a nitride semiconductor. The p-type semiconductor layer includes a nitride semiconductor. The light emitting portion is provided between the n-type semiconductor layer and the p-type semiconductor layer and includes a quantum well layer. The first layer is provided between the light emitting portion and the p-type semiconductor layer. The first layer includes $Al_{x1}Ga_{1-x1}N$, where first Al composition ratio x1 is an atomic ratio of Al among group III elements. The second layer is provided between the first layer and the p-type semiconductor layer. The second layer includes $Al_{x2}Ga_{1-x2}N$, where second Al composition ratio x2 is an atomic ratio of Al among group III elements. The second Al composition ratio x2 is higher than the first Al composition ratio x1. The intermediate layer is provided between the first layer and the light emitting portion. The intermediate layer has a thickness not smaller than 3 nanometers and not larger than 8 nanometers. The intermediate layer includes $In_{z1}Ga_{1-z1}N$, where In composition ratio z1 is an atomic ratio of In among group III elements. The In composition ratio z1 is not lower than 0 and lower than 1.

Hereinafter, an embodiment of the invention is described in detail with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

FIG. 1 is a schematic cross-sectional view illustrating the configuration of a semiconductor light emitting device according to an embodiment of the invention.

Figure 2:
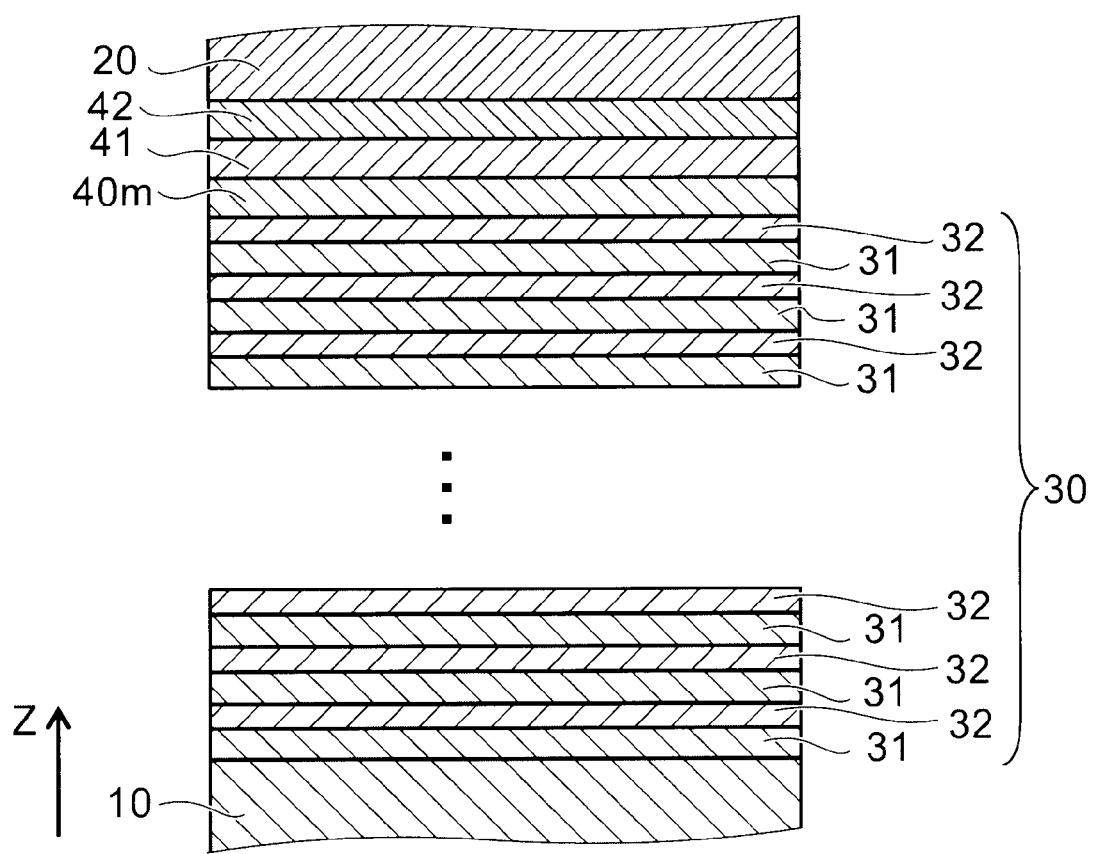
FIG. 2 is a schematic cross-sectional view showing part of the semiconductor light emitting device.

FIG. 2 is a schematic cross-sectional view illustrating the configuration of part of the semiconductor light emitting device according to the embodiment of the invention.

As shown in FIG. 1, a semiconductor light emitting device 110 according to the embodiment of the invention includes: an n-type semiconductor layer 10 including a nitride semiconductor; a p-type semiconductor layer 20 including a nitride semiconductor; a light emitting portion 30 provided between the n-type semiconductor layer 10 and the p-type semiconductor layer 20 and including a quantum well layer; a first layer 41; a second layer 42; and an intermediate layer 40m.

As illustrated in FIG. 1, the n-type semiconductor layer 10, the light emitting portion 30, the intermediate layer 40m, the first layer 41, the second layer 42, and the p-type semiconductor layer 20 are stacked along a Z-axis direction.

The first layer 41 is provided between the light emitting portion 30 and the p-type semiconductor layer 20 and includes AlGaN having a first Al composition ratio x1. That is, the first layer 41 includes $Al_{x1}Ga_{1-x1}N$, where the first Al composition ratio x1 is an atomic ratio of Al among group III elements. The first Al composition ratio x1 is higher than 0 and lower than 1. More specifically, the first Al composition ratio is not lower than 0.001 and not higher than 0.05, for example.

The second layer 42 is provided between the first layer 41 and the p-type semiconductor layer 20 and includes AlGaN having a second Al composition ratio x2 higher than the first Al composition ratio x1. That is, the second layer 42 includes $Al_{x2}Ga_{1-x2}N$, where the second Al composition ratio x2 is an atomic ratio of Al among group III elements. The second Al composition ratio x2 is higher than 0 and lower than 1 and is higher than the first Al composition ratio x1. More specifically, the second Al composition ratio x2 is not lower than 0.1 and not higher than 0.2, for example.

The Al composition ratio (the first Al composition ratio x1, the second Al composition ratio x2, etc.) means a ratio (atomic ratio) of Al among the group III elements.

The intermediate layer 40m is provided between the first layer 41 and the light emitting portion 30. The thickness of the intermediate layer 40m is not smaller than 3 nm (nanometers) and not larger than 8 nm. The intermediate layer 40m includes $In_{z1}Ga_{1-z1}N$ ($0 \leq z1 < 1$). That is, The intermediate layer 40m includes $In_{z1}Ga_{1-z1}N$, where In composition ratio z1 is an atomic ratio of In among group III elements. The In composition ratio z1 is not lower than 0 and lower than 1. In other words, the intermediate layer 40m does not substantially include Al. For example, the intermediate layer 40m includes GaN or InGaN.

As shown in FIG. 2, the light emitting portion 30 includes multiple barrier layers 31 and multiple well layers 32 (quantum well layers) alternately stacked along the Z-axis direction described above. In other words, the light emitting portion 30 includes the multiple barrier layers 31 alternately stacked along the z-axis direction, and the well layers 32 provided between each of the multiple barrier layers 31.

As shown in FIG. 2, in the embodiment, it is assumed that the barrier layer 31 (the barrier layer 31 which is the closest to the n-type semiconductor layer 10 among the multiple barrier layers 31) instead of the well layer 32 is in contact with the n-type to semiconductor layer 10. It is also assumed that the well layer 32 is provided on a p-type semiconductor layer 20 side of the light emitting device 30. In other words, it is assumed that the well layer 32 (the well layer 32 which is the closest to the p-type semiconductor layer 20 among the multiple well layers 32) is in contact with the intermediate layer 40m.

As illustrated in FIG. 1, the n-type semiconductor layer 10 may include, for example, an n-type GaN layer 11 and an n-type guide layer 12 provided between the n-type GaN layer 11 and the light emitting portion 30. The n-type guide layer 12 is based on GaN or InGaN, doped with an n-type impurity such as Si, for example.

The p-type semiconductor layer 20 may include, for example, a p-type GaN contact layer 22 and a p-type GaN layer 21 provided between the p-type GaN contact layer 22 and the second layer 42. The p-type semiconductor layer 20 includes a p-type impurity such as Mg which is doped thereinto with a high concentration. The concentration of the p-type impurity included in the p-type GaN semiconductor layer 21 is lower than the concentration of a p-type impurity included in the p-type GaN contact layer 22.

As shown in FIG. 1, the semiconductor light emitting device 110 according to the embodiment may include a substrate 5 made of, for example, sapphire, a buffer layer 6 provided thereon, an n-type GaN layer 11 provided on the buffer layer 6, and an n-type guide layer 12 provided on the n-type GaN layer 11. The n-type GaN layer 11 and the n-type guide layer 12 correspond to the n-type semiconductor layer 10.

Then, the light emitting portion 30 (the barrier layers 31 and the well layers 32) is provided on the n-type guide layer 12. The intermediate layer 40m is provided on the light emitting portion 30. The first layer 41 is provided on the intermediate layer 40m. The second layer 42 is provided on the first layer 41.

The p-type GaN layer 21 is provided on the second layer 42. The p-type GaN contact layer 22 is provided on the p-type GaN layer 21. The p-type GaN layer 21 and the p-type GaN contact layer 22 correspond to the p-type semiconductor layer 20.

On a first major surface on the p-type semiconductor layer 20 side of the stacked structural body having the configuration as described above, part of the n-type semiconductor layer 10, the light emitting portion 30, the intermediate layer 40m, the first layer 41, the second layer 42, and the p-type semiconductor layer 20 are partially removed and, thus, the n-type semiconductor layer 10 is exposed on the first major surface side. An n-side electrode 71 is provided in contact with the exposed n-type semiconductor layer 10, and a p-side electrode 81 is provided in contact with the p-type semiconductor layer 20.

The above-described semiconductor light emitting device 110 is fabricated, for example, as follows.

First, a buffer layer 6 is formed on a substrate 5 made of sapphire, and the crystal of an n-type GaN layer 11 doped with an n-type impurity is grown. The thickness of the n-type GaN layer 11 is approximately 4 μm (micrometers), for example.

For the crystal growth, an MOCVD (Metal Organic Chemical Vapor Deposition) method is used, for example. In addition to this method, an MBE (Molecular Beam Epitaxy) method and the like may be used for the crystal growth. The n-type impurity may include various elements such as Si, Ge, and Sn. In the specific example, Si is used. The doping amount of Si is approximately $2 \times 10^{18}$ cm$^{-3}$, for example. The substrate 5 may be based on various materials such as GaN, SiC, Si, and GaAs in addition to sapphire.

After that, the crystal of an n-type guide layer 12 is grown on the n-type GaN layer 11. The n-type guide layer 12 is based on GaN doped with an n-type impurity of approximately $1 \times 10^{18}$ cm$^{-3}$, for example. The thickness of the n-type guide layer 12 is approximately 0.1 μm, for example.

Temperatures of growing the n-type GaN layer 11 and the n-type guide layer 12 are 1000° C. to 1100° C., for example.

As the n-type guide layer 12, $In_{0.01}Ga_{0.99}N$ may be used, in addition to GaN. A temperature used for growing the n-type guide layer 12 in the case of using $In_{0.01}Ga_{0.99}N$ is 700° C. to 800° C., for example. The thickness of the n-type guide layer 12 may be 0.1 μm even when $In_{0.01}Ga_{0.99}N$ is used for the n-type guide layer 12.

After that, the light emitting portion 30 is formed on the n-type guide layer 12. For example, the barrier layer 31 including $In_{0.01}Ga_{0.99}N$ and the well layer 32 including undoped $In_{0.15}Ga_{0.85}N$ are alternately stacked in pair for 8 times to form an MQW (Multiple Quantum Well) structure. The thickness of each barrier layer 31 is set to be 5.0 nm, for example. The thickness of each well layer 32 is set to be 2.5 nm, for example. The growing temperatures of the barrier layer 31 and the well layer 32 are 700° C. to 800° C., for example. An n-type impurity of approximately $1 \times 10^{18}$ cm$^{-3}$ may be doped into the barrier layer 31, or the barrier layer 31 may be an undoped layer.

The intermediate layer 40m including, for example, GaN is grown on the light emitting portion 30. The thickness of the intermediate layer 40m is set to be not smaller than 3 nm and not larger than 8 nm. In this example, the thickness of the intermediate layer 40m is set to be 5 nm.

The first layer 41 is grown on the intermediate layer 40m. The first layer 41 is based on $Al_{0.05}Ga_{0.95}N$, for example. In other words, a first Al composition ratio x1 is 0.05. The thickness of the first layer 41 is 5 nm, for example. The first Al composition ratio x1 is substantially 0.05 (plus minus 20%) and the thickness of the first layer 41 is substantially 5 nanometers (plus minus 20%).

The second layer 42 is grown on the first layer 41. The second layer 42 is based on $Al_{0.20}Ga_{0.80}N$. In other words, a second Al composition ratio x2 is 0.20. The thickness of the second layer 42 is 5 nm, for example. The second Al composition ratio x2 is substantially 0.20 (plus minus 20%) and the thickness of the second layer 42 is substantially 5 nanometers (plus minus 20%). In this specific example, the second layer 42 is based on $Al_{0.02}Ga_{0.80}N$ with Mg of approximately $4 \times 10^{19}$ cm$^{-3}$. On the other hand, the first layer 41 is based on $Al_{0.05}Ga_{0.95}N$ being undoped with Mg. As a result, the concentration of the p-type impurity in the second layer 42 is higher than that in the first layer 41.

The p-type GaN layer 21 is grown on the second layer 42. The p-type GaN layer 21 includes Mg doped with a concentration of approximately $1 \times 10^{19}$ cm$^{-3}$. The thickness of the p-type GaN layer 21 is approximately 50 nm, for example. The growing temperature of the p-type GaN layer 21 is 1000° C. to 1100° C., for example.

The p-type GaN contact layer 22 is grown on the p-type GaN layer 21. The p-type GaN contact layer 22 includes Mg doped with a concentration of $1 \times 10^{20}$ cm$^{-3}$. The thickness of the p-type GaN contact layer 22 is approximately 60 nm, for example.

The following device processes are performed on the wafer on which the above-described crystal growth is sequentially performed.

A p-side electrode 81 including, for example, indium tin oxide (ITO) is formed on the p-type GaN contact layer 22. The thickness of the ITO is 0.2 μm, for example. An Au film with a thickness of, for example, 1.0 μm is formed as a p-side pad electrode 82 on part of the ITO.

After the p-side electrode 81 (and the p-side pad electrode 82) is formed, dry etching is performed on part of the stacked structural body described above to expose part of the n-type GaN layer 11. Then, an n-side electrode 71 is formed in a portion where the n-type GaN layer 11 is exposed. The n-side electrode is based on a compound film of titanium/platinum/gold (Ti/Pt/Au), for example. The thickness of this Ti film is approximately 0.5 μm, for example. The thickness of the Pt film is approximately 0.05 μm, for example. The thickness of the Au film is 1.0 μm, for example.

The semiconductor light emitting device 110 is fabricated in this way.

In a semiconductor light emitting device such as an LED, electrons are likely to overflow from the light emitting portion 30. On the other hand, because an activation efficiency of a p-type impurity is lower, a carrier density of holes is likely to be lowered. Moreover, in a nitride semiconductor layer, an effective weight of holes is large. Accordingly, a diffusion length of holes is likely to be small. Thus, an improvement of an injection efficiency of holes to the active layer is required.

According to the results of various experiments carried out by the inventors of this application, it has been found that light emission of a quantum well layer on the p-type semiconductor layer 20 side is dominant in the case of a GaN-based LED in which the quantum well structure including In is used for an active layer. In addition, in order to increase an injection efficiency of holes to an active layer (a light emitting portion 30), it is preferable that an electron overflow suppressing layer including AlGaN is brought closer to the active layer in terms of a balance with the diffusion length of holes. However, it has been found that when the electron overflow suppressing layer is brought excessively closer to the active layer, the influence of spontaneous polarization of AlGaN is exerted on the quantum well layer including In; and therefore, the quantum efficiency decreases contrary to expectation.

The configuration of the embodiment is established based on these findings.

In the semiconductor light emitting device 110 according to the embodiment, the second layer 42 is an AlGaN layer whose Al composition ratio is high and functions as an electron overflow suppressing layer to control overflow of electrons.

In order to increase the effects of controlling the overflow of electrons, it is preferable that an Al composition ratio in the electron overflow suppressing layer is high. On the other hand, when the Al composition ratio in the electron overflow suppressing layer is excessively high, an energy band of the well layer 32 adjacent to the p-type semiconductor layer 20 is bent by the influence of spontaneous polarization. As a result, the light emitting efficiency decreases.

In the semiconductor light emitting device 110 according to the embodiment, the intermediate layer 40m which does not substantially include Al, the first layer 41 whose Al composition ratio is low, and the second layer 42 whose Al composition ratio is high are provided between the light emitting portion 30 and the p-type semiconductor layer 20 in this order from the light emitting portion 30 toward the p-type semiconductor layer 20.

Figure 3:
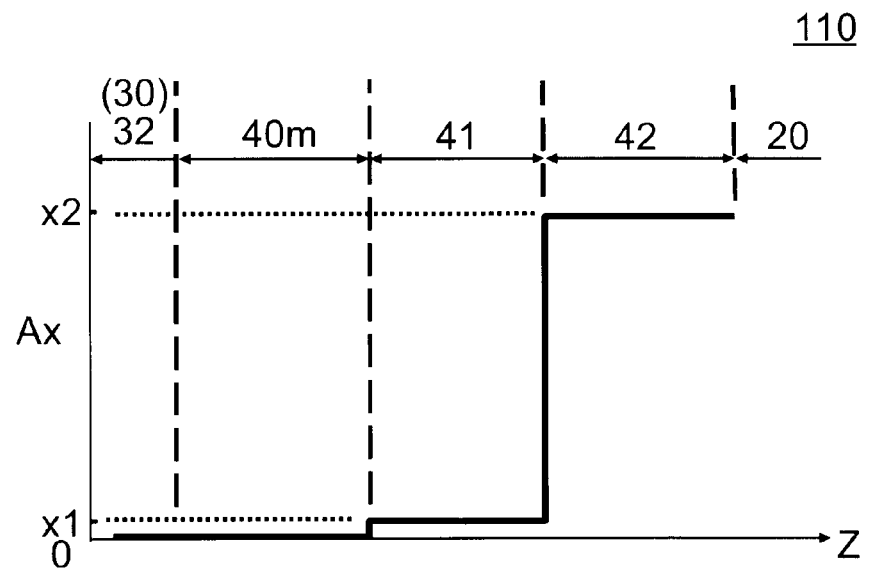
FIG. 3 is a schematic view showing characteristics of the semiconductor light emitting device.

FIG. 3 is a schematic view illustrating characteristics of the semiconductor light emitting device according to the embodiment of the invention.

More specifically, FIG. 3 illustrates changes of the Al composition ratio Ax in the semiconductor layers from the light emitting portion 30 to the p-type semiconductor layer 20 in the semiconductor light emitting device 110. In FIG. 3, the horizontal axis represents the Z-axis direction (stacked direction) and the vertical axis represents an Al composition ratio Ax in the semiconductor layers.

As shown in FIG. 3, at an end (an end on a p-type semiconductor layer 20 side) of the light emitting portion 30, the well layer 32 is provided, and an Al composition ratio Ax in the well layer 32 is substantially 0. The Al composition ratio Ax is also substantially 0 in the intermediate layer 40m. The Al composition ratio Ax in the first layer 41 is a first Al composition ratio x1, which is not lower than 0.001 and not higher than 0.5, for example. The Al composition ratio Ax in the second layer 42 is a second Al composition ratio x2, which is not lower than 0.1 and not higher than 0.2, for example.

In this manner, in the semiconductor light emitting device 110, the Al composition ratios Ax of the intermediate layer 40m, the first layer 41, and the second layer 42 provided between the light emitting portion 30 and the p-type semiconductor layer 20 are increased along a direction from the light emitting portion 30 toward the p-type semiconductor layer 20. The intermediate layer 40m, i.e., a semiconductor layer in contact with the well layer 32 of the light emitting portion 30, does not substantially include Al.

With this configuration, the Al composition ratio Ax becomes high on a side closer to the p-type semiconductor layer 20 between the light emitting portion 30 and the p-type semiconductor layer 20. Accordingly, the effects of the electron overflow suppressing can be sufficiently obtained. In addition, the side closer to the light emitting portion 30 does not substantially include Al. Accordingly, an adverse influence on the energy band characteristics of the well layer 32 due to the spontaneous polarization in the AlGaN layer including Al is suppressed.

Figure 4:
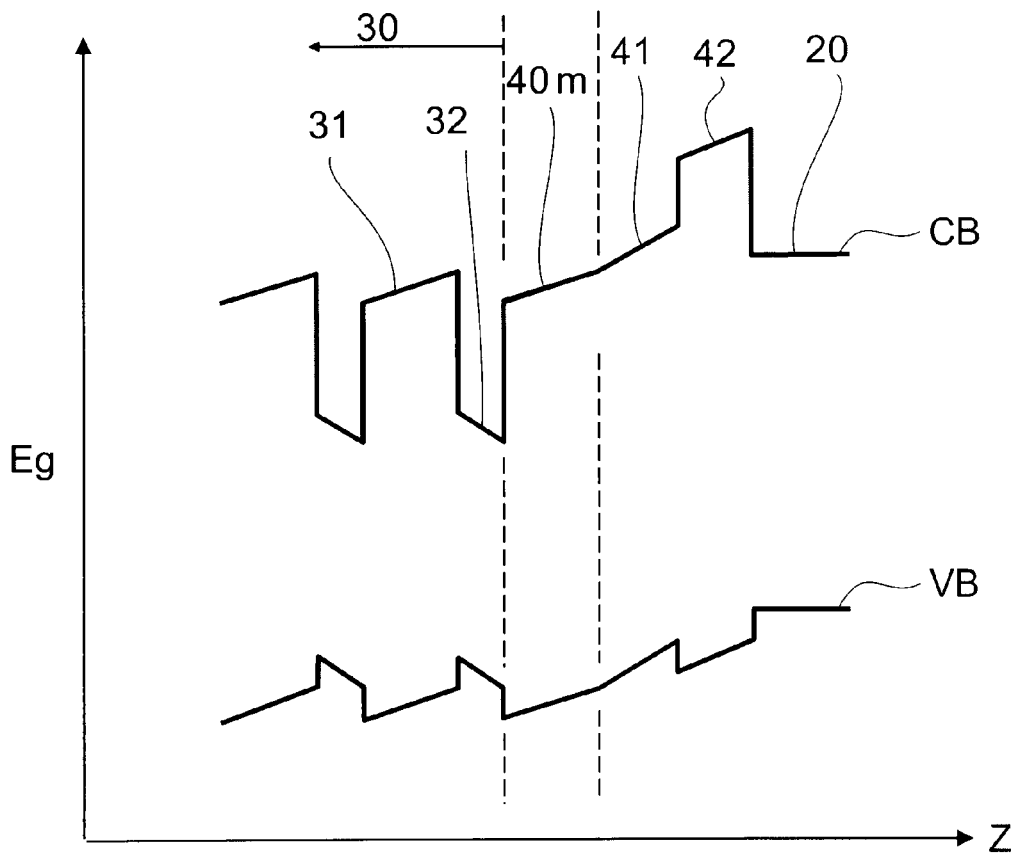
FIG. 4 is a schematic view showing characteristics of the semiconductor light emitting device.

FIG. 4 is a schematic view illustrating characteristics of the semiconductor light emitting device according to the embodiment of the invention.

More specifically, FIG. 4 schematically illustrates the energy band characteristics of the semiconductor layers from the light emitting portion 30 to the p-type semiconductor layer 20 in the semiconductor light emitting device 110. In FIG. 4, the horizontal axis represents the Z-axis direction (stacked direction) and the vertical axis represents an energy Eg. FIG. 4 illustrates a state of a conduction band CB and characteristics of valence band VB.

As shown in FIG. 4, a desired energy band characteristic can be realized from the light emitting portion 30 to the p-type semiconductor layer 20 in the semiconductor light emitting device 110.

In other words, the energy characteristics of the well layer 32 which is the closest to the p-type semiconductor layer 20 is substantially the same as those of the other well layers 32. In other words, the energy characteristics of the well layer 32 which is the closest to the p-type semiconductor layer 20 are substantially not influenced by the second layer 42 whose Al composition ratio Ax is high.

As a result, the overflow of electrons is reduced and the injection efficiency of holes to the active layer can be increased. Thus, the light emitting efficiency is improved.

Figure 5:
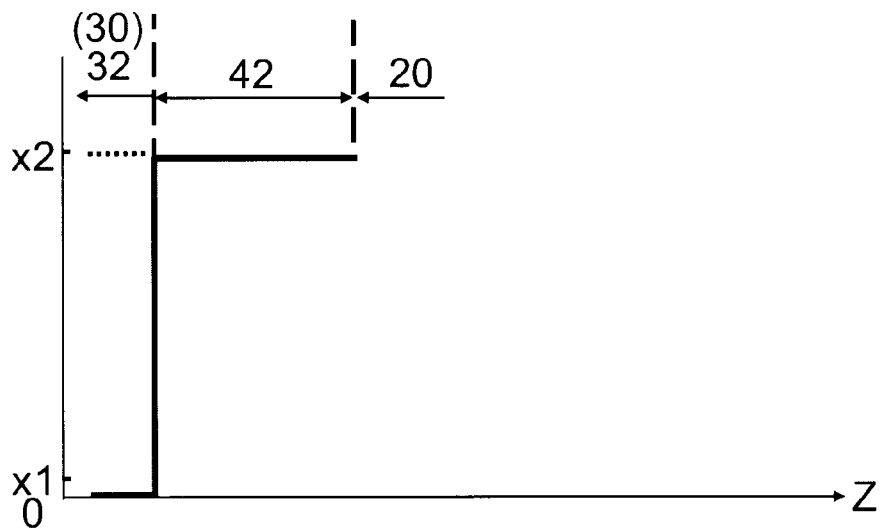
FIG. 5 is a schematic view showing characteristics of a semiconductor light emitting device of a comparative example.

FIG. 5 is a schematic view illustrating characteristics of a semiconductor light emitting device of a comparative example.

More specifically, FIG. 5 illustrates changes of Al composition ratios Ax in semiconductor layers from a light emitting device 30 to a p-type semiconductor layer 20 in a semiconductor light emitting device 119 of the comparative example.

Figure 6:
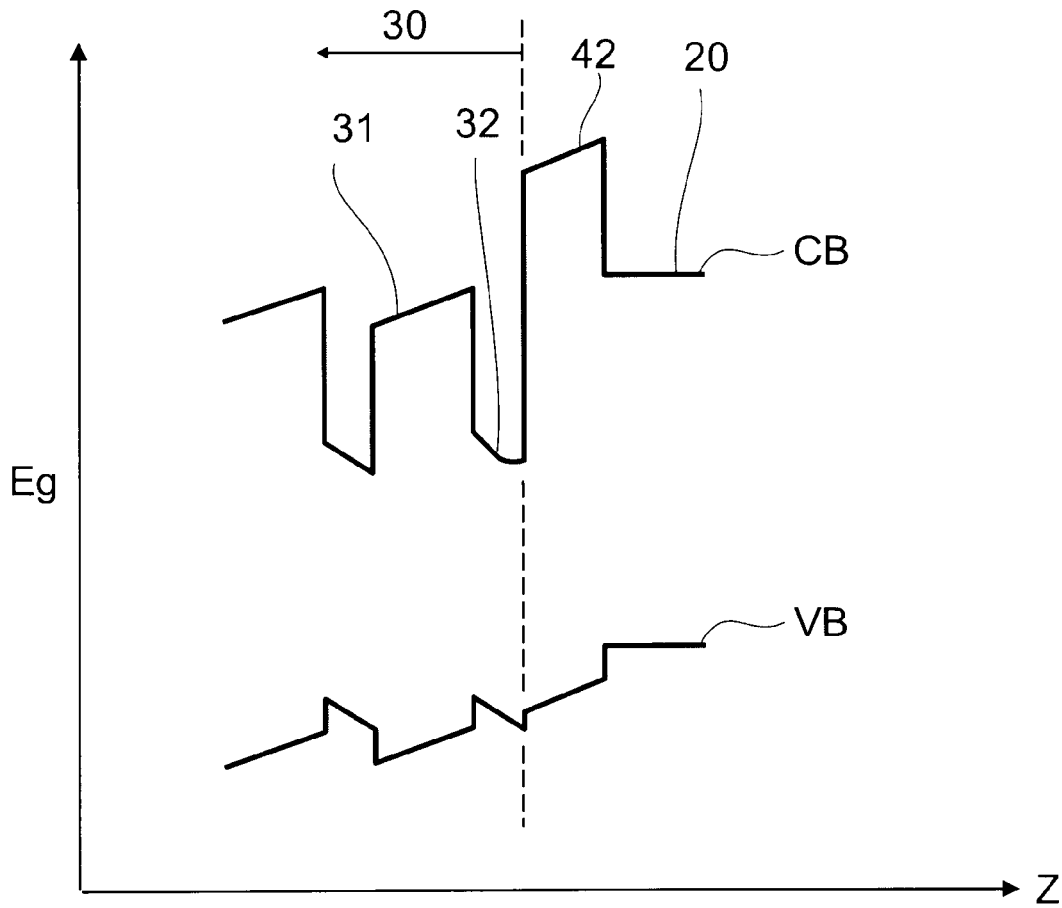
FIG. 6 is a schematic view showing characteristics of a semiconductor light emitting device of a comparative example.

FIG. 6 is a schematic view illustrating characteristics of the semiconductor light emitting device of the comparative example.

More specifically, FIG. 6 schematically illustrates the energy band characteristics in the semiconductor layers from the light emitting portion 30 to the p-type semiconductor layer 20 in the semiconductor light emitting device 119 of the comparative example.

As shown in FIG. 5, the semiconductor light emitting device 119 of the comparative example includes a second layer 42 which is adjacent to a well layer 32 of a light emitting portion 30 and which has a high Al composition ratio.

In this case, as shown in FIG. 6, the energy characteristics of the well layer 32 which is the closest to the p-type semiconductor layer 20 are different from the energy characteristics of the other well layers 32. In other words, the energy band of the well layer 32 which is the closest to the p-type semiconductor layer 20 is bent due to the spontaneous polarization in the second layer 42 whose Al composition ratio is high. Thus, the efficiency decreases in the semiconductor light emitting device 119 of the comparative example.

In contrast, in the semiconductor light emitting device 110, the intermediate layer 40$m$ and the first layer 41 are provided, thereby, the influence on the well layer 32 by the spontaneous polarization of the second layer 42 with the high Al composition ratio Ax can be suppressed. Accordingly, the energy band characteristics can be controlled to be a desired state. Thus, the overflow of electrons is reduced and the injection efficiency of holes to the active layer can be increased. As a result, the light emitting efficiency is high.

Hereinafter, characteristics of examples according to this embodiment will be described with comparative examples.

The configurations of semiconductor light emitting devices 110$a$ to 110$c$ of first to third examples according to this embodiment are the same as that of the semiconductor light emitting device 110 illustrated in FIG. 1. Thus, the description thereof is omitted.

First Example

In the semiconductor light emitting device 110$a$ of the first example, an intermediate layer 40$m$ includes of GaN which does not substantially includes Al and has a thickness of 5 nm. A first layer 41 includes $Al_{0.01}Ga_{0.99}N$ (i.e., a first Al composition ratio x1=0.01) and has a thickness of 5 nm. The concentration of Mg in the first layer 41 is approximately $1\times10^{17}$ $cm^{-3}$ to $1\times10^{19}$ $cm^{-3}$, which is relatively a low concentration. A second layer 42 includes $Al_{0.2}Ga_{0.8}N$ (i.e., a second Al composition ratio x2=0.2) and has a thickness of 5 nm. The concentration of Mg in the second layer 42 is approximately $1\times10^{19}$ $cm^{-3}$ to $1\times10^{20}$ $cm^{-3}$, which is relatively a high concentration.

Second Example

In the semiconductor light emitting device 110$b$ of the second example, a first layer 41 includes $Al_{0.01}Ga_{0.99}N$ and has a thickness of 2.5 nm. The configuration other than that is the same as that of the first example.

Third Example

In the semiconductor light emitting device 110$c$ of the third example, a first layer 41 includes $Al_{0.01}Ga_{0.99}N$ and has a thickness of 0.5 nm. The configuration other than that is the same as that of the first example.

First Comparative Example

The configuration of a semiconductor light emitting device 119$a$ of a first comparative example is the same as that of the semiconductor light emitting device 119 of the comparative example illustrated in FIG. 5. More specifically, the semiconductor light emitting device 119$a$ does not include an intermediate layer 40$m$ and a first layer 41. The configuration other than that is the same as that of the semiconductor light emitting device 110$a$ of the first example.

More specifically, in the semiconductor light emitting device 119$a$ of the first comparative example, a second layer 42 is provided in contact with a well layer 32 of a light emitting portion 30. The second layer 42 includes $Al_{0.2}Ga_{0.8}N$ and has a thickness of 5 nm. The concentration of Mg in the second layer 42 is $1\times10^{19}$ $cm^{-3}$ to $1\times10^{20}$ $cm^{-3}$.

Second Comparative Example

A semiconductor light emitting device 119$b$ of a second comparative example has an intermediate layer 40$m$, a first layer 41, and a second layer 42. In other words, the configuration of the semiconductor light emitting device 119$b$ is similar to that of the semiconductor light emitting device 110 illustrated in FIG. 1. However, the intermediate layer 40$m$ is thin. In the semiconductor light emitting device 119$b$, the thickness of the intermediate layer 40$m$ is 0.5 nm. The configuration other than that (e.g., the configurations of the first layer 41 and the second layer 42) is the same as that of the semiconductor light emitting device 110$a$ of the first example.

Third Comparative Example

A semiconductor light emitting device 119$c$ of a third embodiment has an intermediate layer 40$m$, a first layer 41, and a second layer 42. In other words, the configuration of the semiconductor light emitting device 119$c$ is similar to that of the semiconductor light emitting device 110 illustrated in FIG. 1. However, the intermediate layer 40m is thin. In the semiconductor light emitting device 119c, the thickness of the intermediate layer 40m is 2.5 nm. The configuration other than that (e.g., the configurations of the first layer 41 and the second layer 42) is the same as that of the semiconductor light emitting device 110a of the first example.

Figure 7:
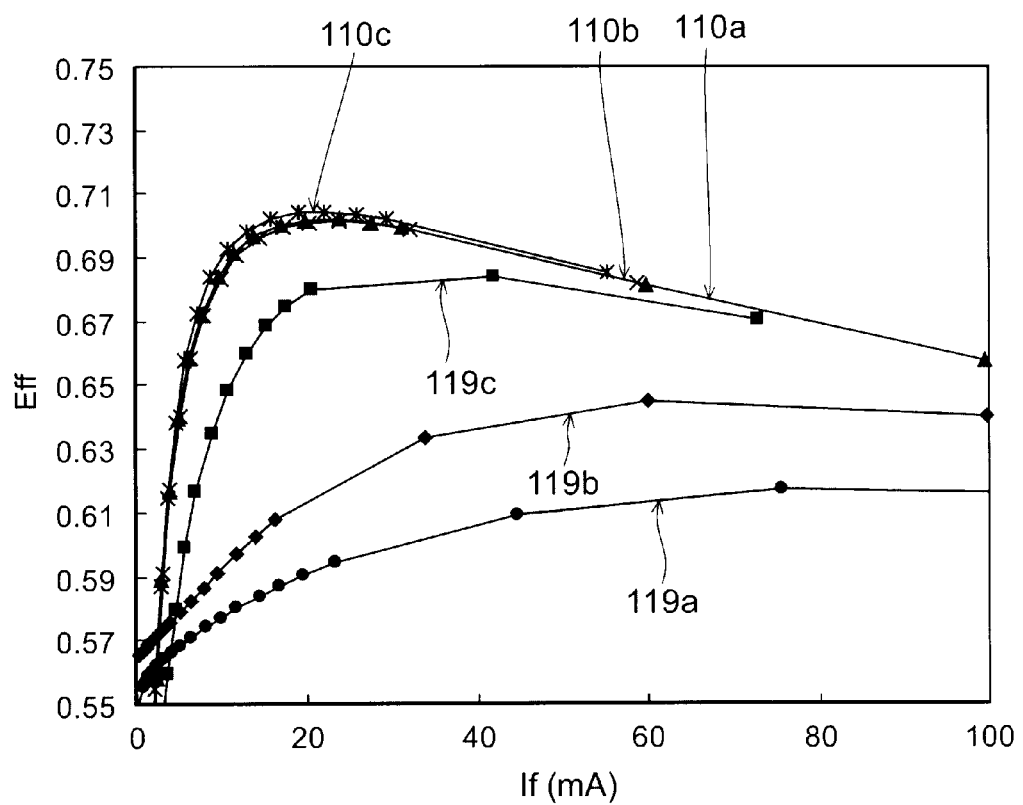
FIG. 7 is a graph showing characteristics of semiconductor light emitting devices.

FIG. 7 is a graph illustrating characteristics of the semiconductor light emitting devices.

More specifically, FIG. 7 illustrates characteristics of the semiconductor light emitting devices 110a to 110c of the first to third examples and the semiconductor light emitting devices 119a to 119c of the first to third comparative examples. In FIG. 7, the horizontal axis represents a current If flowing through each of the semiconductor light emitting devices and the vertical axis represents a light emitting efficiency Eff.

These semiconductor light emitting devices 110a to 110c and 119a to 119c are a blue LED whose peak wavelength is 450 nm.

As shown in FIG. 7, in the semiconductor light emitting device 119a of the first comparative example in which an intermediate layer 40m is not provided, the light emitting efficiency Eff is extremely small. It is thought that this comes from that the second layer 42 with high Al composition ratio Ax is in contact with the well layer 32 of the light emitting portion 30 and the characteristics of the energy Eg of the well layer 32 is deteriorated due to the spontaneous polarization in the second layer 42.

The light emitting efficiency Eff is low also in the semiconductor light emitting device 119b of the second comparative example in which the thickness of the intermediate layer 40m is 0.5 nm.

In the semiconductor light emitting device 119c of the third comparative example in which the thickness of the intermediate layer 40m is 2.5 nm, the light emitting efficiency Eff increases as compared with the semiconductor light emitting device 119b, but it is not sufficient.

In contrast, all the semiconductor light emitting devices of the first to third examples show a high light emitting efficiency Eff. Since the high light emitting efficiency is observed even when the first layer 41 has a thickness of 0.5 nm, it can be seen that a thickness of approximately 0.5 nm may be enough for the first layer 41 in the case where the thickness of the intermediate layer 40m is approximately 5 nm.

As described above, in the semiconductor light emitting device 110 (the semiconductor light emitting devices 110a to 110c) according to the embodiment, the high light emitting efficiency Eff can be obtained when the intermediate layer 40m has a thickness of at least approximately 5 nm. When the thickness of the intermediate layer 40m is, for example, not larger than 2.5 nm (e.g., the semiconductor light emitting devices 119b and 119c of the second and third comparative examples), the light emitting efficiency Eff is low.

Figures 8A, 8B, 8C:
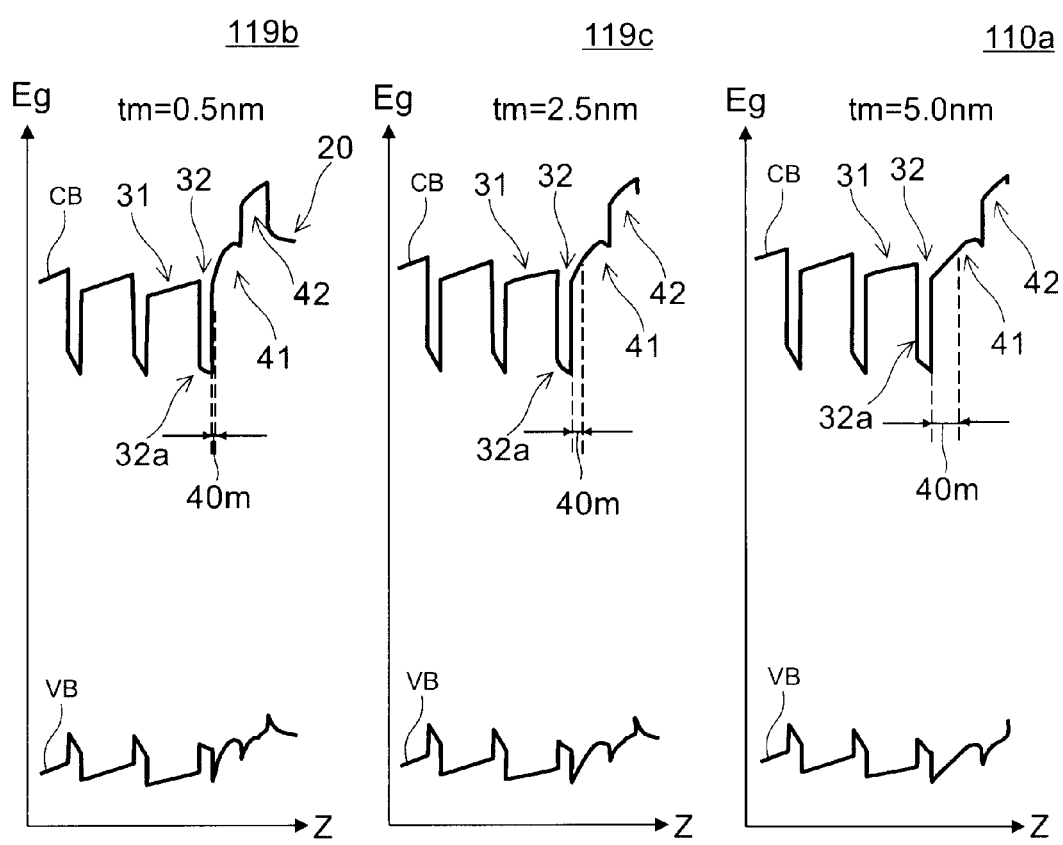
FIG. 8A to FIG. 8C are schematic views showing the simulation results of the characteristics of the semiconductor light emitting devices.

FIG. 8A to FIG. 8C are schematic views illustrating the simulation results of the characteristics of the semiconductor light emitting devices.

More specifically, FIG. 8A, FIG. 8B, and FIG. 8C illustrate the results of simulating the energy band characteristics in the semiconductor layers from the light emitting portion 30 to the p-type semiconductor layer 20 in each of the semiconductor light emitting device 110a of the first example and the semiconductor light emitting devices 119b and 119c of the second and third comparative examples.

As shown in FIG. 8A, in the semiconductor light emitting device 119b of the second comparative example in which the thickness of the intermediate layer 40m is 0.5 nm, the energy characteristic of the well layer 32 which is the closest to the p-type semiconductor layer 20 is curved, and the energy band is bent. It is thought that this is due to the influence of the spontaneous polarization of the second layer 42 whose Al composition ratio Ax is high, for example.

As shown in FIG. 8B, also in the semiconductor light emitting device 119c of the third comparative example in which the thickness of the intermediate layer 40m is 2.5 nm, the energy characteristic of the well layer 32 which is the closest to the p-type semiconductor layer 20 is also curved, and the curve of the energy band is not sufficiently removed.

In contrast, as shown in FIG. 8C, in the semiconductor light emitting device 110a of the first embodiment in which the thickness of the intermediate layer 40m is 5 nm, the energy characteristic of the well layer 32 which is the closest to the p-type semiconductor layer 20 is linear, and the curve of the energy band is sufficiently removed. As a result, a high light emitting efficiency can be obtained.

Consequently, the thickness of the intermediate layer 40m is set to be not smaller than 3 nm in the semiconductor light emitting device 110 according to the embodiment.

Hereinafter, characteristics of a light emitting efficiency Eff and a voltage Vf of semiconductor light emitting devices including the case where an intermediate layer 40m is thick will be described.

Fourth Comparative Example

A semiconductor light emitting device 119d of a fourth comparative example has an intermediate layer 40m, a first layer 41, and a second layer 42. In other words, the configuration of the semiconductor light emitting device 119d is similar to that of the semiconductor light emitting device 110 illustrated in FIG. 1. However, the intermediate layer 40m is thick. In the semiconductor light emitting device 119d, the thickness of the intermediate layer 40m is 10.0 nm. The configuration other than that (e.g., the configurations of the first layer 41 and the second layer 42) is the same as that of the semiconductor light emitting device 110a of the first example.

Figure 9A:
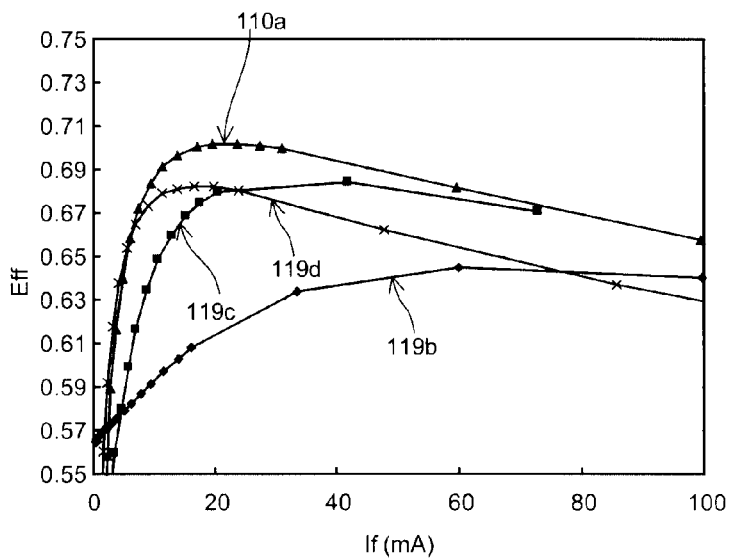
FIG. 9A to FIG. 9C are graphs showing characteristics of the semiconductor light emitting devices.
Figure 9B:
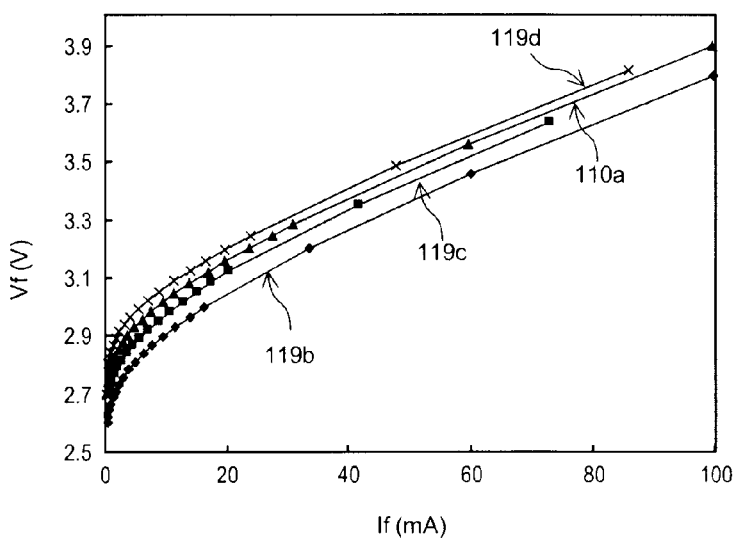
Figure 9C:
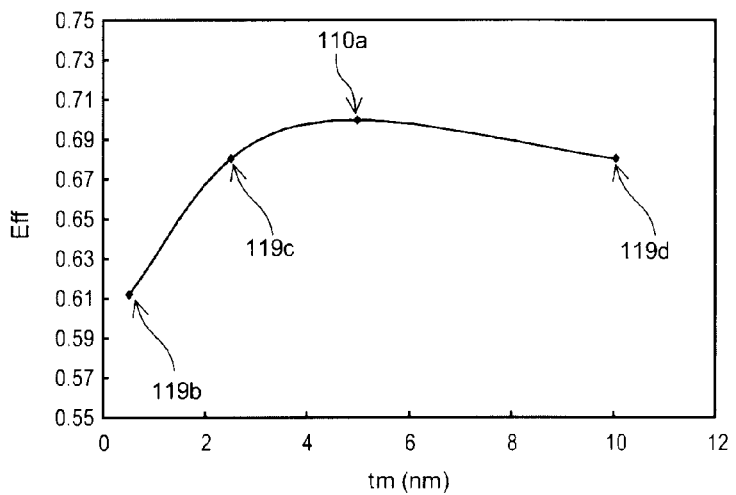

FIG. 9A to FIG. 9C are graphs illustrating characteristics of the semiconductor light emitting devices.

More specifically, FIG. 9A and FIG. 9B illustrate the light emitting efficiencies Eff and voltages Vf of the semiconductor light emitting device 110a of the first example, as well as the semiconductor light emitting devices 119b, 119c, and 119d of the second, third, and fourth comparative examples. In FIG. 9A and FIG. 9B, the horizontal axis represents a current If flowing through each semiconductor light emitting device. In FIG. 9A, the vertical axis represents a light emitting efficiency Eff. In FIG. 9B, the vertical axis represents a voltage Vf. FIG. 9C illustrates a relationship between the thickness tm of the intermediate layer 40m and a light emitting efficiency Eff in these semiconductor light emitting devices. In FIG. 9C, the horizontal axis represents the thickness tm of the intermediate layer 40m and the vertical axis represents a light emitting efficiency Eff when the current If is 20 mA.

As shown in FIG. 9A, the light emitting efficiency Eff is low in the case where the thickness tm of the intermediate layer 40m is as thin as 0.5 nm and 2.5 nm like the semiconductor light emitting devices 119b and 119c and in the case where the thickness tm of the intermediate layer 40m is excessively thick like the semiconductor light emitting device 119d.

As shown in FIG. 9C, in the case where the thickness of the intermediate layer 40m is approximately not smaller than 3 nm and not larger than 8 nm, the light emitting efficiency Eff is high.

As described above, the light emitting efficiency is low when the thickness tm of the intermediate layer 40m is excessively large. It is thought that the reason is that the injection efficiency of holes to the active layer (the light emitting portion 30) decreases when the intermediate layer 40m is thick because the mobility of holes is small in a nitride semiconductor.

Furthermore, as shown in FIG. 9B, in the semiconductor light emitting device 119d whose intermediate layer 40m is thick, the voltage Vf is high. With regard to this point also, the thickness tm of the intermediate layer 40m is properly set.

As described above, in the semiconductor light emitting device 110 according to the embodiment, the thickness of the intermediate layer 40m is not smaller than 3 nm and not larger than 8 nm.

Figure 10A:
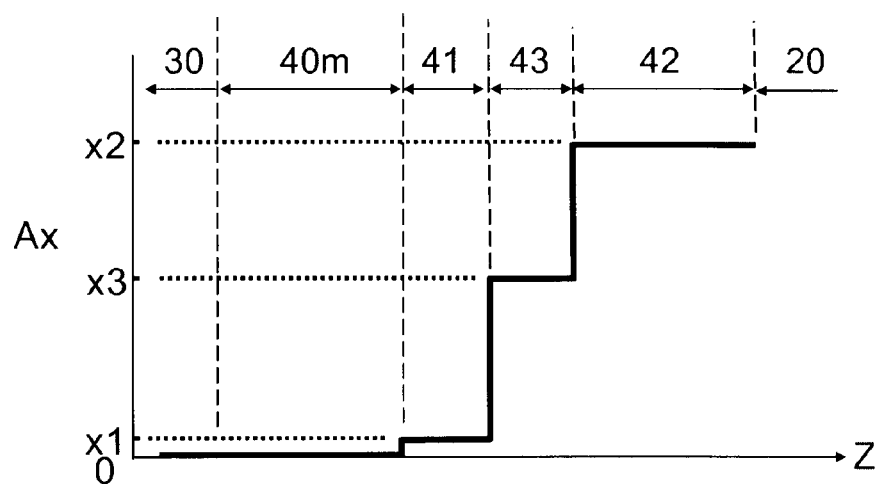
FIG. 10A to FIG. 10C are schematic views showing characteristics of semiconductor light emitting devices.
Figure 10B:
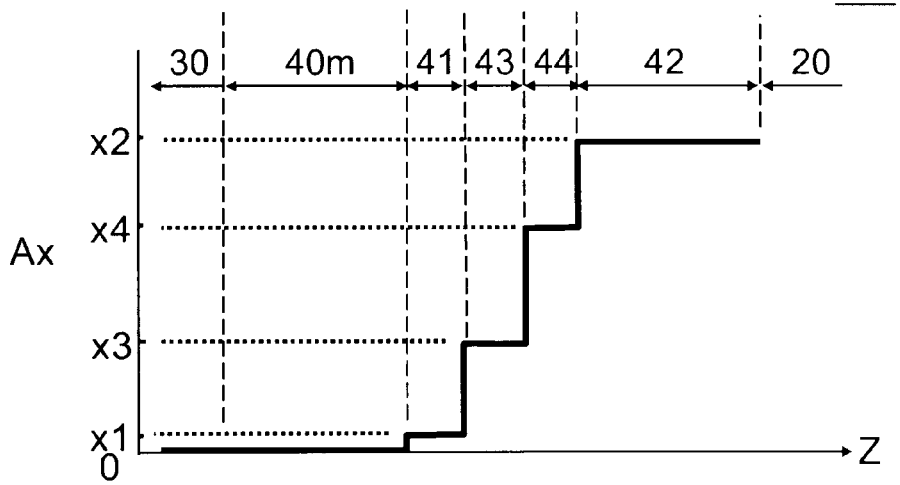
Figure 10C:
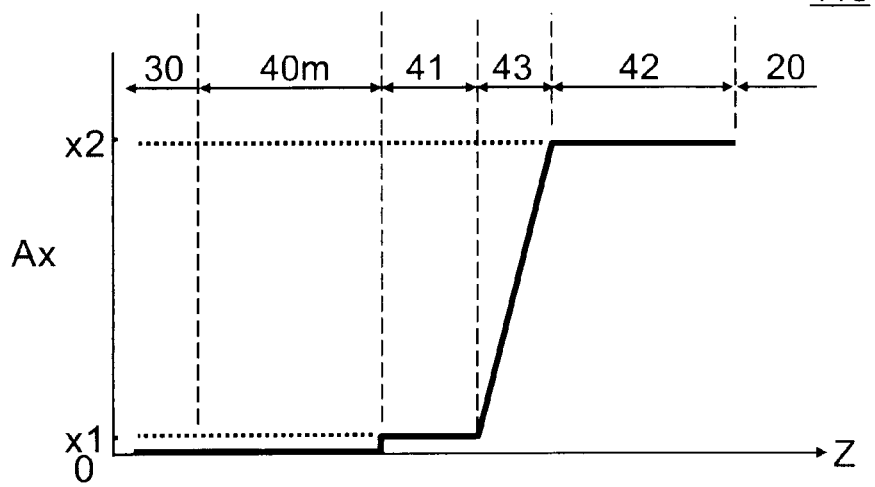

FIG. 10A to FIG. 10C are schematic views illustrating characteristics of semiconductor light emitting devices according to the embodiment of the invention.

More specifically, FIG. 10A to FIG. 10C illustrate characteristics of other semiconductor light emitting devices 111 to 113 according to the embodiment, respectively. FIG. 10A to FIG. 10C illustrate the changes of Al composition ratios Ax in semiconductor layers from a light emitting portion 30 to a p-type semiconductor layer 20. In FIG. 10A to FIG. 10C, the horizontal axis represents the Z-axis direction (stacked direction) and the vertical axis represents an Al composition ratio Ax in the semiconductor layers.

As shown in FIG. 10A, the other semiconductor light emitting device 111 according to the embodiment includes an intermediate layer 40m, a first layer 41, and a second layer 42 and further includes a third layer 43 which is provided between the first layer 41 and the second layer 42 and which includes AlGaN having a third Al composition ratio x3. That is, the third layer 43 includes $Al_{x3}Ga_{1-x3}N$, where third Al composition ratio x3 is an atomic ratio of Al among group III elements. The third Al composition x3 is between the first Al composition ratio x1 and the second Al composition ratio x2.

As shown in FIG. 10B, the other semiconductor light emitting device 112 according to the embodiment includes an intermediate layer 40m, a first layer 41, a second layer 42, and a third layer 43 and further includes a fourth layer 44 which is provided between the third layer 43 and the second layer 42 and which includes AlGaN having a fourth Al composition ratio x4. That is, the fourth layer 44 includes $Al_{x4}Ga_{1-x4}N$, where the fourth Al composition ratio x4 is an atomic ratio of Al among group III elements. The fourth Al composition ratio x4 is between the third Al composition ratio x3 and the second Al composition ratio x2.

As described above, multiple layers can be provided between the intermediate layer 40m which does not substantially include Al and the second layer 42 which include Al with a high composition ratio. The Al composition ratio in the multiple layers increases from the intermediate layer 40m toward the second layer 42.

The number of the multiple layers to be provided between the intermediate layer 40m and the second layer 42 are arbitrarily.

Furthermore, the Al composition ratio Ax may change inside one layer.

As shown in FIG. 10C, the other semiconductor light emitting device 113 according to the embodiment includes an intermediate layer 40m, a first layer 41, and a second layer 42 and further includes a third layer 43 which is provided between the first layer 41 and the second layer 42 and which includes AlGaN having a third Al composition ratio x3 between a first Al composition ratio x1 and a second Al composition ratio x2. The Al composition ratio Ax in the third layer 43 increases along the direction from a light emitting portion 30 to a p-type semiconductor layer 20.

The light emitting efficiency can be improved also in the semiconductor light emitting devices 111 to 113 having such configurations as described above.

As described above, in the semiconductor light emitting devices according to the embodiment, the configuration in which the Al composition ratio Ax is increased stepwise or continuously (that is, "increased") from the first layer 41 to the second layer 42 is used, and the characteristics of the changes of the Al composition ratio Ax are arbitrarily.

In the configuration of the light emitting portion 30 of the semiconductor light emitting device 110 illustrated in FIG. 2, the light emitting portion 30 can further include a barrier layer 31 provided on a p-type semiconductor layer 20 side of the well layer 32 which is the closest to the p-type semiconductor layer 20. At this time, in the semiconductor light emitting device 110 according to the embodiment, the barrier layer 31 does not substantially include Al. In other words, the barrier layer 31 is based on $In_{z2}Ga_{1-z2}N$ ($0 \leq z2 < 1$). In this case, the total thickness of the barrier layer 31 and the intermediate layer 40m is set to be not smaller than 3 nm and not larger than 8 nm.

In addition, the intermediate layer 40m in the semiconductor light emitting device 110 may be considered as the barrier layer 31 provided on the p-type semiconductor layer 20 side of the well layer 32 which is the closest to the p-type semiconductor layer 20 in the light emitting portion 30. However, the barrier layer 31 provided on the p-type semiconductor layer 20 side of the well layer 32 which is the closest to the p-type semiconductor layer 20 is considered as the intermediate layer 40m.

In this specification, "nitride semiconductors" are intended herein to include semiconductors with all the compositions which are obtained by changing each of composition ratios x, y, and z in the respective ranges in the chemical formula: $B_xIn_yAl_zGa_{1-x-y-z}N$ ($0 \leq x \leq 1$, $0 \leq y \leq 1$, $0 \leq z \leq 1$, $x+y+z \leq 1$). Furthermore, in the above chemical formula, the "nitride semiconductors" are intended to include ones further including the group V elements other than N (nitride), ones further including various elements which are to be added to control various properties such as conductivity types, and ones further including various elements which are included unintentionally.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as n-type semiconductor layers, p-type semiconductor layers, light emitting portions, well layers, barrier layers, intermediate layers, first to forth layers, electrodes, substrates, and buffer layers are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
   an n-type semiconductor layer including a nitride semiconductor;
   a p-type semiconductor layer including a nitride semiconductor;
   a light emitting portion provided between the n-type semiconductor layer and the p-type semiconductor layer and including a quantum well layer;
   a first layer provided between the light emitting portion and the p-type semiconductor layer, the first layer including $Al_{x1}Ga_{1-x1}N$, where first Al composition ratio $x1$ is an atomic ratio of Al among group III elements, the first layer being doped with Mg;
   a second layer provided between the first layer and the p-type semiconductor layer, the second layer including $Al_{x2}Ga_{1-x2}N$, where second Al composition ratio $x2$ is an atomic ratio of Al among group III elements, the second Al composition ratio $x2$ being higher than the first Al composition ratio $x1$; and
   an intermediate layer provided between the first layer and the light emitting portion, the intermediate layer having a thickness not smaller than 3 nanometers and not larger than 8 nanometers and including $In_{z1}Ga_{1-z1}N$, where In composition ratio $z1$ is an atomic ratio of In among group III elements, the In composition ratio $z1$ being not lower than 0 and lower than 1.

2. The device according to claim 1, wherein a concentration of a p-type impurity in the second layer is higher than a concentration of a p-type impurity in the first layer.

3. The device according to claim 1, wherein an Al composition ratio increases from the first layer toward the second layer.

4. The device according to claim 1, wherein the first Al composition ratio $x1$ is not lower than 0.001 and not higher than 0.05.

5. The device according to claim 1, wherein the first Al composition ratio $x1$ is substantially 0.05 and a thickness of the first layer is substantially 5 nanometers.

6. The device according to claim 1, wherein the second Al composition ratio $x2$ is not lower than 0.1 and not higher than 0.2.

7. The device according to claim 1, wherein the second Al composition ratio $x2$ is substantially 0.20 and a thickness of the second layer is substantially 5 nanometers.

8. The device according to claim 1, wherein the intermediate layer does not include Al.

9. The device according to claim 1, wherein the intermediate layer is made of one of GaN and InGaN.

10. The device according to claim 1, further comprising:
    a third layer provided between the first layer and the second layer, the third layer including $Al_{x3}Ga_{1-x3}N$, where third Al composition ratio $x3$ is an atomic ratio of Al among group III elements, the third Al composition ratio $x3$ being between the first Al composition ratio and the second Al composition ratio; and
    a fourth layer provided between the third layer and the second layer, the fourth layer including $Al_{x4}Ga_{1-x4}N$, where fourth Al composition ratio $x4$ is an atomic ratio of Al among group III elements, the fourth Al composition ratio $x4$ being between the third Al composition ratio $x3$ and the second Al composition ratio $x2$.

11. The device according to claim 1, further comprising a third layer provided between the first layer and the second layer, the third layer including $Al_{x3}Ga_{1-x3}N$, where third Al composition ratio $x3$ is an atomic ratio of Al among group III elements, the third Al composition ratio being between the first Al composition ratio $x1$ and the second Al composition ratio $x2$,
    the third Al composition ratio $x3$ in the third layer increases along a direction from the light emitting portion toward the p-type semiconductor layer.

12. The device according to claim 11, wherein the third layer includes a plurality of layers.

13. The device according to claim 1, wherein the light emitting portion includes a plurality of barrier layers and a plurality of well layers, the barrier layers and the well layers being alternately stacked along a direction from the n-type semiconductor layer toward the p-type semiconductor layer.

14. The device according to claim 13, wherein one of the plurality of barrier layers is in contact with the n-type semiconductor layer.

15. The device according to claim 13, wherein one of the plurality of well layers is in contact with the intermediate layer.

16. The device according to claim 1, wherein the n-type semiconductor layer includes an n-type GaN layer and a n-type guide layer, the n-type guide layer being provided between the n-type GaN layer and the light emitting portion and being made of one of GaN including Si and InGaN including Si.

17. The device according to claim 1, wherein the p-type semiconductor layer includes a p-type GaN contact layer and a p-type GaN layer provided between the p-type GaN contact layer and the second layer, a concentration of a p-type impurity included in the p-type GaN layer being lower than a concentration of a p-type impurity included in the p-type GaN contact layer.

18. The device according to claim 1, further comprising:
    a substrate made of sapphire and provided on a side of the n-type semiconductor layer opposite to the p-type semiconductor layer; and
    a buffer layer provided between the substrate and the n-type semiconductor layer.

19. The device according to claim 1, further comprising:
    an n-side electrode provided in contact with an exposed part of the n-type semiconductor layer; and
    a p-side electrode provided in contact with the p-type semiconductor layer.

20. The device according to claim 1, wherein the concentration of Mg in the first layer is not less than $1\times10^{17}$ cm$^{-3}$ and not more than $1\times10^{19}$ cm$^{-3}$.

21. A semiconductor light emitting device, comprising:
    an n-type semiconductor layer including a nitride semiconductor;

a p-type semiconductor layer including a nitride semiconductor;

a light emitting portion provided between the n-type semiconductor layer and the p-type semiconductor layer and including a quantum well layer;

a first layer provided between the light emitting portion and the p-type semiconductor layer, the first layer including $Al_{X1}Ga_{1-x1}N$, where first Al composition ratio x1 is an atomic ratio of Al among group III elements;

a second layer provided between the first layer and the p-type semiconductor layer, the second layer including $Al_{x2}Ga_{1-x2}N$, where second Al composition ratio x2 is an atomic ratio of Al among group III elements, the second Al composition ratio x2 being higher than the first Al composition ratio x1;

a third layer provided between the first layer and the second layer, the third layer including $Al_{x3}Ga_{1-x3}N$, where third Al composition ratio x3 is an atomic ratio of Al among group III elements, the third Al composition being between the first Al composition ratio x1 and the second Al composition ratio x2, and an intermediate layer provided between the first layer and the light emitting portion, the intermediate layer having a thickness not smaller than 3 nanometers and not larger than 8 nanometers and including $In_{z1}Ga_{1-z1}N$, where In composition ratio z1 is an atomic ratio of In among group III elements, the In composition ratio z1 being not lower than 0 and lower than 1.

22. The device according to claim 21, wherein a concentration of a p-type impurity in the second layer is higher than a concentration of a p-type impurity in the first layer.

23. The device according to claim 21, wherein an Al composition ratio increases from the first layer toward the second layer.

24. The device according to claim 21, wherein the first Al composition ratio x1 is not lower than 0.001 and not higher than 0.05.

25. The device according to claim 21, wherein the first Al composition ratio x1 is substantially 0.05 and a thickness of the first layer is substantially 5 nanometers.

26. The device according to claim 21, wherein the second Al composition ratio x2 is not lower than 0.1 and not higher than 0.2.

27. The device according to claim 21, wherein the second Al composition ratio x2 is substantially 0.20 and a thickness of the second layer is substantially 5 nanometers.

28. The device according to claim 21, wherein the intermediate layer does not include Al.

29. The device according to claim 21, wherein the intermediate layer is made of one of GaN and InGaN.

30. The device according to claim 21, further comprising:
a third layer provided between the first layer and the second layer, the third layer including $Al_{x3}Ga_{1-x3}N$, where third Al composition ratio x3 is an atomic ratio of Al among group III elements, the third Al composition ratio x3 being between the first Al composition ratio and the second Al composition ratio; and
a fourth layer provided between the third layer and the second layer, the fourth layer including $Al_{x4}Ga_{1-x4}N$, where fourth Al composition ratio x4 is an atomic ratio of Al among group III elements, the fourth Al composition ratio x4 being between the third Al composition ratio x3 and the second Al composition ratio x2.

31. The device according to claim 21, further comprising a third layer provided between the first layer and the second layer, the third layer including $Al_{x3}Ga_{1-x3}N$, where third Al composition ratio x3 is an atomic ratio of Al among group III elements, the third Al composition ratio being between the first Al composition ratio x1 and the second Al composition ratio x2, the third Al composition ratio x3 in the third layer increases along a direction from the light emitting portion toward the p-type semiconductor layer.

32. The device according to claim 31, wherein the third layer includes a plurality of layers.

33. The device according to claim 21, wherein the light emitting portion includes a plurality of barrier layers and a plurality of well layers, the barrier layers and the well layers being alternately stacked along a direction from the n-type semiconductor layer toward the p-type semiconductor layer.

34. The device according to claim 33, wherein one of the plurality of barrier layers is in contact with the n-type semiconductor layer.

35. The device according to claim 33, wherein one of the plurality of well layers is in contact with the intermediate layer.

36. The device according to claim 21, wherein the n-type semiconductor layer includes an n-type GaN layer and a n-type guide layer, the n-type guide layer being provided between the n-type GaN layer and the light emitting portion and being made of one of GaN including Si and InGaN including Si.

37. The device according to claim 21, wherein the p-type semiconductor layer includes a p-type GaN contact layer and a p-type GaN layer provided between the p-type GaN contact layer and the second layer, a concentration of a p-type impurity included in the p-type GaN layer being lower than a concentration of a p-type impurity included in the p-type GaN contact layer.

38. The device according to claim 21, further comprising:
a substrate made of sapphire and provided on a side of the n-type semiconductor layer opposite to the p-type semiconductor layer; and
a buffer layer provided between the substrate and the n-type semiconductor layer.

39. The device according to claim 31, further comprising:
an n-side electrode provided in contact with an exposed part of the n-type semiconductor layer; and
a p-side electrode provided in contact with the p-type semiconductor layer.

40. A semiconductor light emitting device, comprising:
an n-type semiconductor layer including a nitride semiconductor;
a p-type semiconductor layer including a nitride semiconductor;
a light emitting portion provided between the n-type semiconductor layer and the p-type semiconductor layer and including a quantum well layer;
a first layer provided between the light emitting portion and the p-type semiconductor layer, the first layer including $Al_{X1}Ga_{1-x1}N$, where first Al composition ratio x1 is an atomic ratio of Al among group III elements;
a second layer provided between the first layer and the p-type semiconductor layer and in direct contact with the first layer, the second layer including $Al_{x2}Ga_{1-x2}N$, where second Al composition ratio x2 is an atomic ratio of Al among group III elements, the second Al composition ratio x2 being higher than the first Al composition ratio x1; and
an intermediate layer provided between the first layer and the light emitting portion, the intermediate layer having a thickness not smaller than 3 nanometers and not larger than 8 nanometers and including $In_{z1}Ga_{1-z1}N$, where In composition ratio z1 is an atomic ratio of In among group III elements, the In composition ratio z1 being not lower than 0 and lower than 1.

41. The device according to claim 40, wherein a concentration of a p-type impurity in the second layer is higher than a concentration of a p-type impurity in the first layer.

42. The device according to claim 40, wherein an Al composition ratio increases from the first layer toward the second layer.

43. The device according to claim 40, wherein the first Al composition ratio x1 is not lower than 0.001 and not higher than 0.05.

44. The device according to claim 40, wherein the first Al composition ratio x1 is substantially 0.05 and a thickness of the first layer is substantially 5 nanometers.

45. The device according to claim 40, wherein the second Al composition ratio x2 is not lower than 0.1 and not higher than 0.2.

46. The device according to claim 40, wherein the second Al composition ratio x2 is substantially 0.20 and a thickness of the second layer is substantially 5 nanometers.

47. The device according to claim 40, wherein the intermediate layer does not include Al.

48. The device according to claim 40, wherein the intermediate layer is made of one of GaN and InGaN.

49. The device according to claim 40, further comprising:
a third layer provided between the first layer and the second layer, the third layer including $Al_{x3}Ga_{1-x3}N$, where third Al composition ratio x3 is an atomic ratio of Al among group III elements, the third Al composition ratio x3 being between the first Al composition ratio and the second Al composition ratio; and
a fourth layer provided between the third layer and the second layer, the fourth layer including $Al_{x4}Ga_{1-x4}N$, where fourth Al composition ratio x4 is an atomic ratio of Al among group III elements, the fourth Al composition ratio x4 being between the third Al composition ratio x3 and the second Al composition ratio x2.

50. The device according to claim 40, further comprising a third layer provided between the first layer and the second layer, the third layer including $Al_{x3}Ga_{1-x3}N$, where third Al composition ratio x3 is an atomic ratio of Al among group III elements, the third Al composition ratio being between the first Al composition ratio x1 and the second Al composition ratio x2, the third Al composition ratio x3 in the third layer increases along a direction from the light emitting portion toward the p-type semiconductor layer.

51. The device according to claim 50, wherein the third layer includes a plurality of layers.

52. The device according to claim 40, wherein the light emitting portion includes a plurality of barrier layers and a plurality of well layers, the barrier layers and the well layers being alternately stacked along a direction from the n-type semiconductor layer toward the p-type semiconductor layer.

53. The device according to claim 52, wherein one of the plurality of barrier layers is in contact with the n-type semiconductor layer.

54. The device according to claim 52, wherein one of the plurality of well layers is in contact with the intermediate layer.

55. The device according to claim 40, wherein the n-type semiconductor layer includes an n-type GaN layer and a n-type guide layer, the n-type guide layer being provided between the n-type GaN layer and the light emitting portion and being made of one of GaN including Si and InGaN including Si.

56. The device according to claim 40, wherein the p-type semiconductor layer includes a p-type GaN contact layer and a p-type GaN layer provided between the p-type GaN contact layer and the second layer, a concentration of a p-type impurity included in the p-type GaN layer being lower than a concentration of a p-type impurity included in the p-type GaN contact layer.

57. The device according to claim 40, further comprising:
a substrate made of sapphire and provided on a side of the n-type semiconductor layer opposite to the p-type semiconductor layer; and
a buffer layer provided between the substrate and the n-type semiconductor layer.

58. The device according to claim 40, further comprising:
an n-side electrode provided in contact with an exposed part of the n-type semiconductor layer; and
a p-side electrode provided in contact with the p-type semiconductor layer.

* * * * *